US009793916B2

(12) United States Patent
Kim

(10) Patent No.: US 9,793,916 B2
(45) Date of Patent: Oct. 17, 2017

(54) LEVEL SHIFTER, DIGITAL-TO-ANALOG CONVERTER, AND BUFFER AMPLIFIER, AND SOURCE DRIVER AND ELECTRONIC DEVICE INCLUDING THE SAME

(71) Applicant: INNOAXIS CO., LTD, Namyangju-si, Gyeonggi-do (KR)

(72) Inventor: Hwi-Cheol Kim, Seoul (KR)

(73) Assignee: INNOAXIS CO., LTD, Namyangju-si, Gyeonggi-do (KR)

( * ) Notice: Subject to any disclaimer, the term of this patent is extended or adjusted under 35 U.S.C. 154(b) by 0 days.

(21) Appl. No.: 15/465,123

(22) Filed: Mar. 21, 2017

(65) Prior Publication Data
US 2017/0272093 A1    Sep. 21, 2017

(30) Foreign Application Priority Data

Mar. 21, 2016  (KR) .................... 10-2016-0033570

(51) Int. Cl.
| *H03M 1/78* | (2006.01) |
| *H03M 7/00* | (2006.01) |
| *H03K 19/0185* | (2006.01) |
| *G11C 19/00* | (2006.01) |
| *G09G 3/20* | (2006.01) |

(52) U.S. Cl.
CPC .......... *H03M 1/785* (2013.01); *G09G 3/2092* (2013.01); *G11C 19/00* (2013.01); *H03K 19/018521* (2013.01); *H03M 7/00* (2013.01); *G09G 2300/0828* (2013.01); *G09G 2300/0871* (2013.01)

(58) Field of Classification Search
CPC  H03M 1/785; H03M 7/00; H03K 19/018521; G11C 19/00; G09G 3/2092
USPC .................................................. 341/144–154
See application file for complete search history.

(56) References Cited

U.S. PATENT DOCUMENTS

| 5,708,434 | A | * | 1/1998 | Hasegawa | ............... | H03M 1/08 341/148 |
| 5,831,566 | A | * | 11/1998 | Ginetti | .................. | H03M 1/682 341/144 |
| 6,448,916 | B1 | * | 9/2002 | Leung | ................. | H03M 1/0663 341/144 |
| 6,448,917 | B1 | * | 9/2002 | Leung | ................. | H03M 1/0663 341/144 |

(Continued)

*Primary Examiner* — Lam T Mai
(74) *Attorney, Agent, or Firm* — Paratus Law Group, PLLC

(57) ABSTRACT

A level shifter, a digital-to-analog converter (DAC), and a buffer amplifier, and a source driver and an electronic device including the same are provided. The source driver includes a level shifter configured to receive digital bits and provide a level-shifted output signal; a DAC including a resistor string configured to provide a plurality of gradation voltages formed by an upper limit voltage and a lower limit voltage being received through one end and the other end, and an N-type metal oxide semiconductor (NMOS) switch and a P-type MOS (PMOS) switch configured to be controlled by the level-shifted output signal and output a gradation voltage corresponding to the level-shifted output signal; and an amplifier configured to amplify a signal provided by the digital-to-analog converter, and the lower limit voltage is provided to a body electrode of the NMOS switch.

8 Claims, 10 Drawing Sheets

(56) References Cited

U.S. PATENT DOCUMENTS

| | | | |
|---|---|---|---|
| 6,486,817 B1 * | 11/2002 | Okada | H03M 1/682 341/144 |
| 8,907,831 B1 * | 12/2014 | Aftab | H03M 1/687 341/144 |
| 2007/0052569 A1 * | 3/2007 | Saito | H03M 1/0602 341/154 |
| 2007/0171112 A1 * | 7/2007 | Park | H03M 1/0845 341/144 |
| 2012/0249350 A1 * | 10/2012 | Prater | H03M 1/1061 341/118 |

* cited by examiner

LEVEL SHIFTER, DIGITAL-TO-ANALOG CONVERTER, AND BUFFER AMPLIFIER, AND SOURCE DRIVER AND ELECTRONIC DEVICE INCLUDING THE SAME

CROSS-REFERENCE TO RELATED APPLICATION

This application claims priority to and the benefit of Korean Patent Application No. 10-2016-0033570, filed on Mar. 21, 2016, the disclosure of which is incorporated herein by reference in its entirety.

BACKGROUND

1. Field of the Invention

The present invention relates to a level shifter, a digital-to-analog converter, and a buffer amplifier, and a source driver and an electronic device including the same.

2. Discussion of Related Art

Nowadays, most electronic devices such as mobile phones, computers, and display devices are implemented with a silicon-based complementary metal oxide semiconductor (CMOS) circuit. The CMOS circuit includes a P-type MOS (PMOS) device, which is turned on when a threshold voltage or less is applied to a gate electrode thereof, and an N-type MOS (NMOS) device, which is turned on when a threshold voltage or more is applied thereto, and a circuit in which the PMOS device and the NMOS device are complementarily operated with each other is configured.

SUMMARY OF THE INVENTION

In a complementary metal oxide semiconductor (CMOS) circuit, an N-type MOS (NMOS) device and a P-type MOS (PMOS) device receive a power supply voltage and a ground voltage and output a signal that swings between the voltages, and the PMOS device and the NMOS device of the CMOS circuit should not be destroyed even when a voltage difference of the power supply voltage and the ground voltage is applied in order to perform a desired function. As an example, an NMOS device and a PMOS device which are not destroyed and are operated at a voltage difference of 10V have a greater channel length and channel width than an NMOS device and a PMOS device which are operated at a voltage difference of 1.2V. That is, a size of a device to which voltages are provided is increased as a difference of a power supply voltage and a ground voltage applied to the device is increased.

However, there is a case in which an output signal does not need to swing from the power supply voltage to the ground voltage. As an example, a signal that swings between the power supply voltage and a lower limit voltage, which is not 0V, may be needed. Even in this case, in a CMOS circuit according to a conventional art, for convenience of a circuit design, a signal that swings within a desired voltage range has been formed by providing the power supply voltage and the ground voltage to the circuit. Accordingly, since a voltage difference provided to each device configuring the circuit is increased, a die size needed for forming the circuit is increased, and thus a cost of forming the circuit is increased such that it is uneconomical.

In a source driver, a level shifter, a digital-to-analog converter, and a buffer that are used to convert a digital signal operating in a low voltage into an analog signal are operated in a higher voltage region than the digital signal. The source driver is formed as a device having a great size so as not to be destroyed by the high voltage and reliably operate, and the source driver needs a great die area since thousands of channels are included in the source driver.

In order to solve the problems of the conventional art, the present invention is directed to a circuit capable to decreasing a die size needed for forming a CMOS circuit that forms a signal swinging between an upper limit voltage and a lower limit voltage, which is not 0V.

According to one aspect of the present invention, there is provided a level shifter that converts a level of an input, including: a first level shifter module configured to receive an input signal and output a signal that swings between a middle voltage and a reference voltage; and a second level shifter module configured to output a signal that swings between an upper limit voltage and a lower limit voltage in response to the input signal, wherein the second level shifter module includes an NMOS transistor, and the lower limit voltage is provided to a body electrode of the NMOS transistor.

According to another aspect of the present invention, there is provided a digital-to-analog converter (DAC), including; a resistor string in which a plurality of resistors are connected; and a plurality of NMOS transistors in which a plurality of gradation voltages formed by an upper limit voltage and a lower limit voltage being received through one end and the other end of the resistor string and respectively provided to drain electrodes, control signals are provided to control gate electrodes, and the gradation voltages are output through source electrodes, wherein the plurality of NMOS transistors are arranged in a P well, and the P well and body electrodes of the plurality of NMOS transistors are electrically connected and receive a well bias voltage.

According to still another aspect of the present invention, there is provided a buffer amplifier that operates between an upper limit voltage and a lower limit voltage, which is greater than 0V, and includes an operational amplifier in which an output is negatively fed back to an input, the operational amplifier including: a first stage including a folded cascode pair and a level converter that converts levels of an output signals of the folded cascode pair; and a second stage including a class AB amplifier that amplifies an output signal of the first stage, wherein the first stage and the second stage are cascaded and connected, the operational amplifier includes a plurality of NMOS transistors, and the lower limit voltage is provided to body electrodes of the plurality of NMOS transistors.

According to yet another aspect of the present invention, there is provided a source driver that drives a display panel, including: a level shifter configured to receive digital bits and provide a level-shifted output signal; a DAC including a resistor string configured to provide a plurality of gradation voltages formed by an upper limit voltage and a lower limit voltage being received through one end and the other end, and an NMOS switch and a PMOS switch configured to be controlled by the level-shifted output signal and output a gradation voltage corresponding to the level-shifted output signal; and an amplifier configured to amplify a signal provided by the digital-to-analog converter, wherein the lower limit voltage is provided to a body electrode of the NMOS switch.

According to yet another aspect of the present invention, there is provided an electronic device, including: a source driver including a level shifter configured to receive digital bits and provide a level-shifted output signal, a DAC including a resistor string configured to provide a plurality of gradation voltages formed by an upper limit voltage and a lower limit voltage being received through one end and the other end, and a plurality of switches configured to be controlled by the level-shifted output signal and output a gradation voltage corresponding to the level-shifted output signal, and an amplifier configured to amplify a signal provided from the digital-to-analog converter, wherein the switches includes NMOS switches in which the lower limit voltage is provided to body electrodes, and a display panel driven by the source driver.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
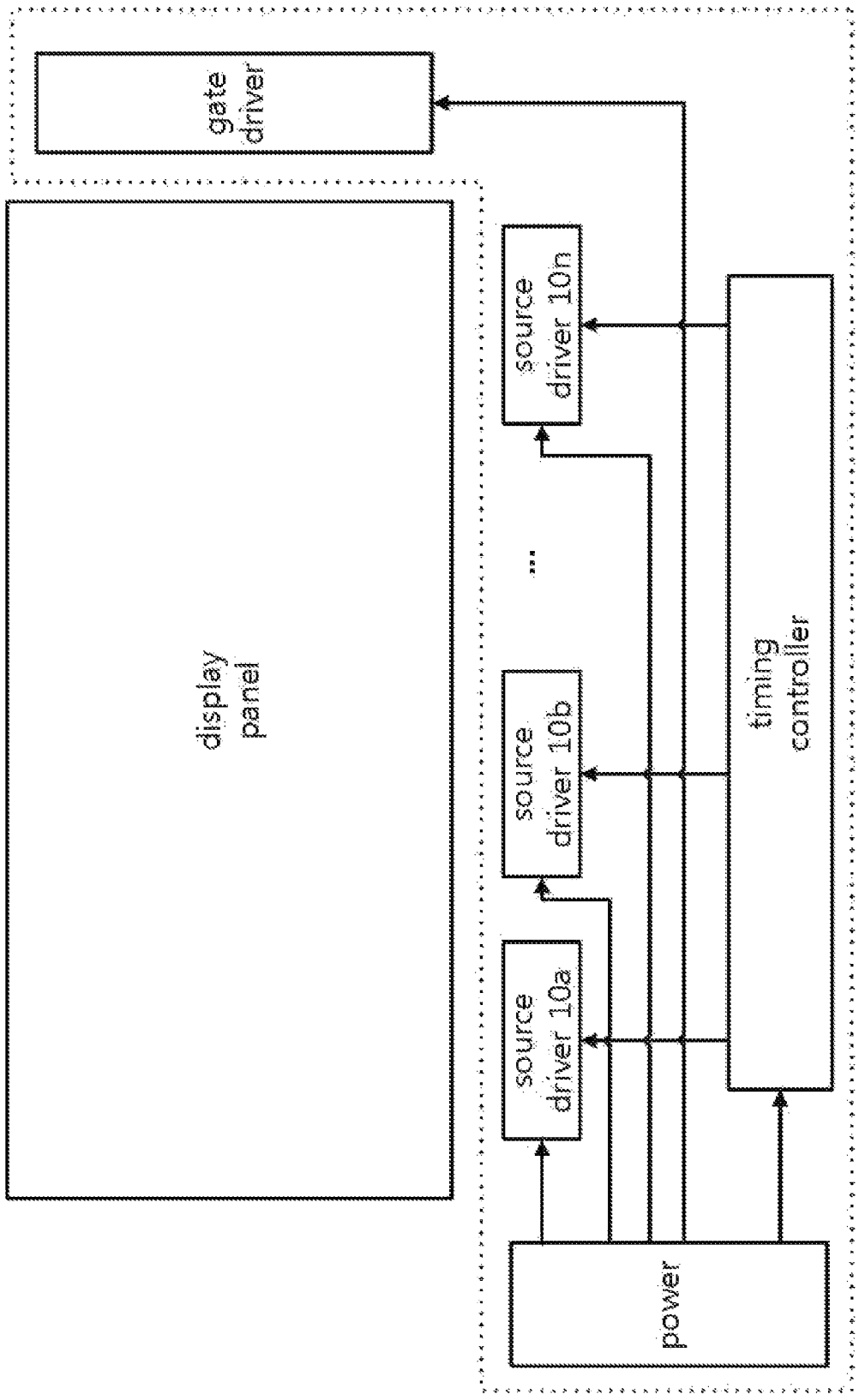
FIG. 1 is a schematic diagram illustrating a configuration of a display system.

Since a description related to the present invention is merely for structurally or functionally explaining embodiments, it should be understood that the scope of the present invention is not limited by the embodiments described in the specification. That is, since the embodiments of the present invention are variously changeable and may have various forms, it should be understood that the scope of the present invention includes equivalents capable of implementing the technical spirit of the present invention.

Meanwhile, meanings of the terms described in the specification should be understood as follows.

Although the terms first, second, etc. may be used herein in order to differentiate one element from another element, the scope of the present invention is not to be construed as limited by these terms. For example, a first element could be termed a second element, and similarly, a second element could be termed a first element.

The articles "a," "an," and "the" are singular in that they have a single referent, however the use of the singular form in the present document does not preclude the presence of more than one referent. It should be further understood that the terms "comprises," "comprising," "includes," and/or "including," when used herein, specify the presence of stated features, items, steps, operations, elements, components and/or groups thereof, but do not preclude the presence or addition of one or more other features, items, steps, operations, elements, components, and/or groups thereof.

Unless steps are clearly described otherwise, each step may be performed differently from a flow of an operation described in the specification. That is, each step may be performed simultaneously, be performed at substantially the same time, or be performed in a reverse order.

The term "and/or" used herein to describe embodiments of the present invention may be used to refer to each and all elements of a corresponding list. As an example, it should be understood that the terms "A and/or B" refers to each of A and B and all of A and B.

In order to describe embodiments of the present invention, a size, height, thickness, or the like thereof may be intentionally exaggerated in the accompanying drawings for convenience of explanation, and such alterations may not be made according to a ratio. Further, one element shown in the accompanying drawing may be expressed by being intentionally reduced, and another element may be expressed by being intentionally enlarged.

Unless otherwise defined, all terms used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art, and this specification and is not to be interpreted in an idealized or overly formal sense unless expressly so defined herein.

Embodiments which will be described hereinafter may be applied to an electronic circuit using a metal oxide semiconductor field effect transistor (MOSFET), and an example of a digital-to-analog converter (DAC) and a level shifter included in a source driver will be described, but this is for convenience of explanation and is not intended to limit the technical scope of the present invention.

Hereinafter, embodiments of the present invention will be described with reference to the accompanying drawings. FIG. 1 is a schematic diagram illustrating a configuration of a display system. Referring to FIG. 1, a display system according to an embodiment of the present invention may include a display panel, a gate driver, and source drivers 10a, 10b, . . . , and 10n, and may also include a timing controller which changes a characteristic of a screen source applied from the outside or controls a driving time according to a resolution and a characteristic of the display system. The timing controller and the source drivers 10a, 10b, . . . , and 10n may be implemented as separate chips according to the characteristic of the display panel, or as one chip as shown in the drawing.

Figure 2:
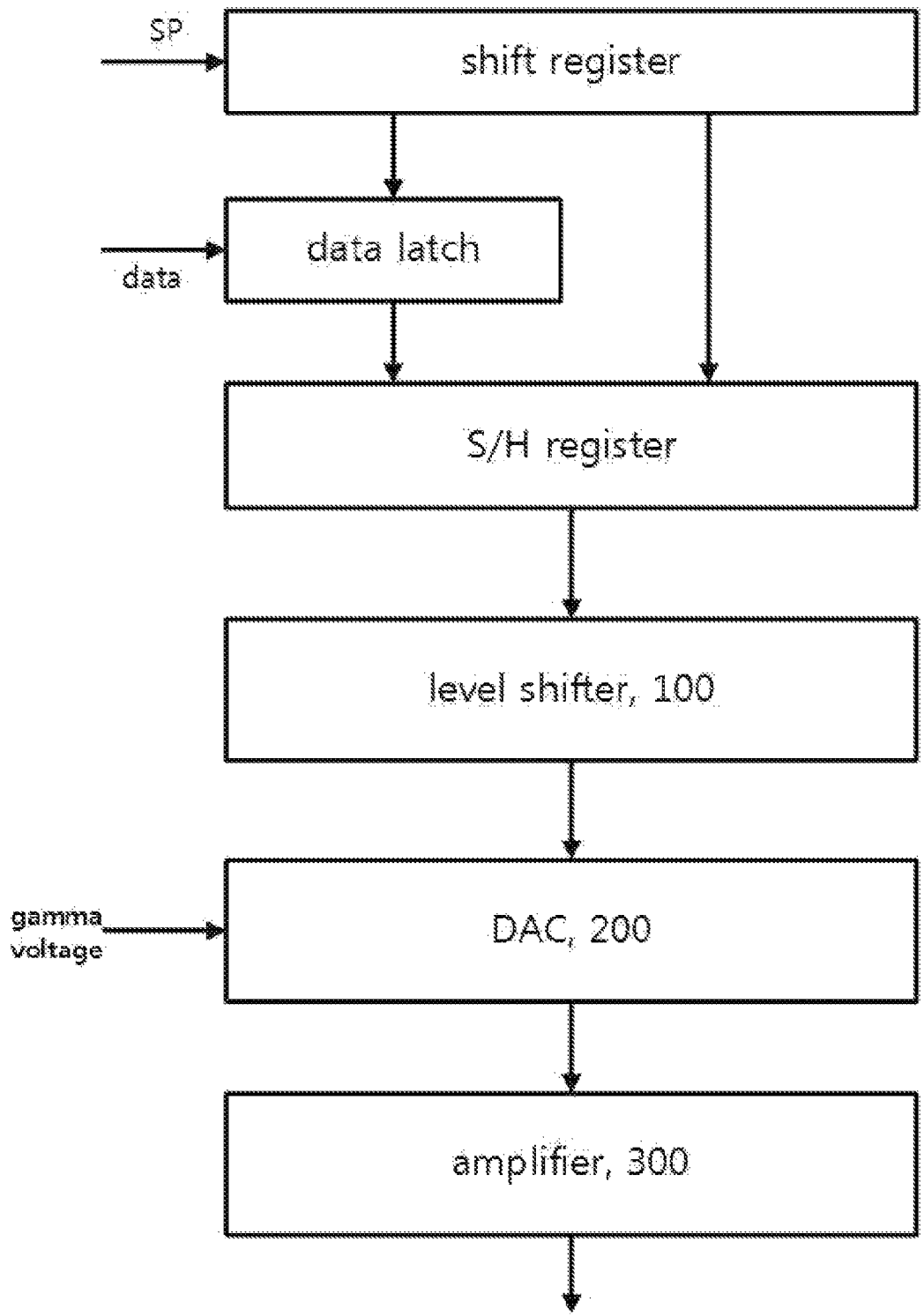
FIG. 2 is a schematic block diagram illustrating a source driver according to an embodiment of the present invention.

FIG. 2 is a schematic block diagram illustrating a source driver 10 according to an embodiment of the present invention. Referring to FIG. 2, the source driver 10 may include a shift register, a data latch, a sample/hold (S/H) register, a level shifter 100, a DAC 200, and an amplifier 300.

The shift register may sequentially shift and output an input start pulse SP. The data latch may latch up and provide image data, and the S/H register may sample the latched-up image data according to the start pulse SP and hold the sampled data to provide the sampled data to the level shifter 100. In an embodiment, all of the shift register, the data latch, and the S/H register may receive a digital signal as an input and provide the digital signal as an output. The level shifter 100 may receive digital bits and provide a control signal in which a level is shifted to swing between desired voltage levels. The DAC 200 may receive a gamma voltage and provide a signal corresponding to the control signal provided from the level shifter 100, and the amplifier 300 may amplify an analog signal and provide the amplified analog signal to the display panel so that an image corresponding to input data is displayed.

Figure 3:
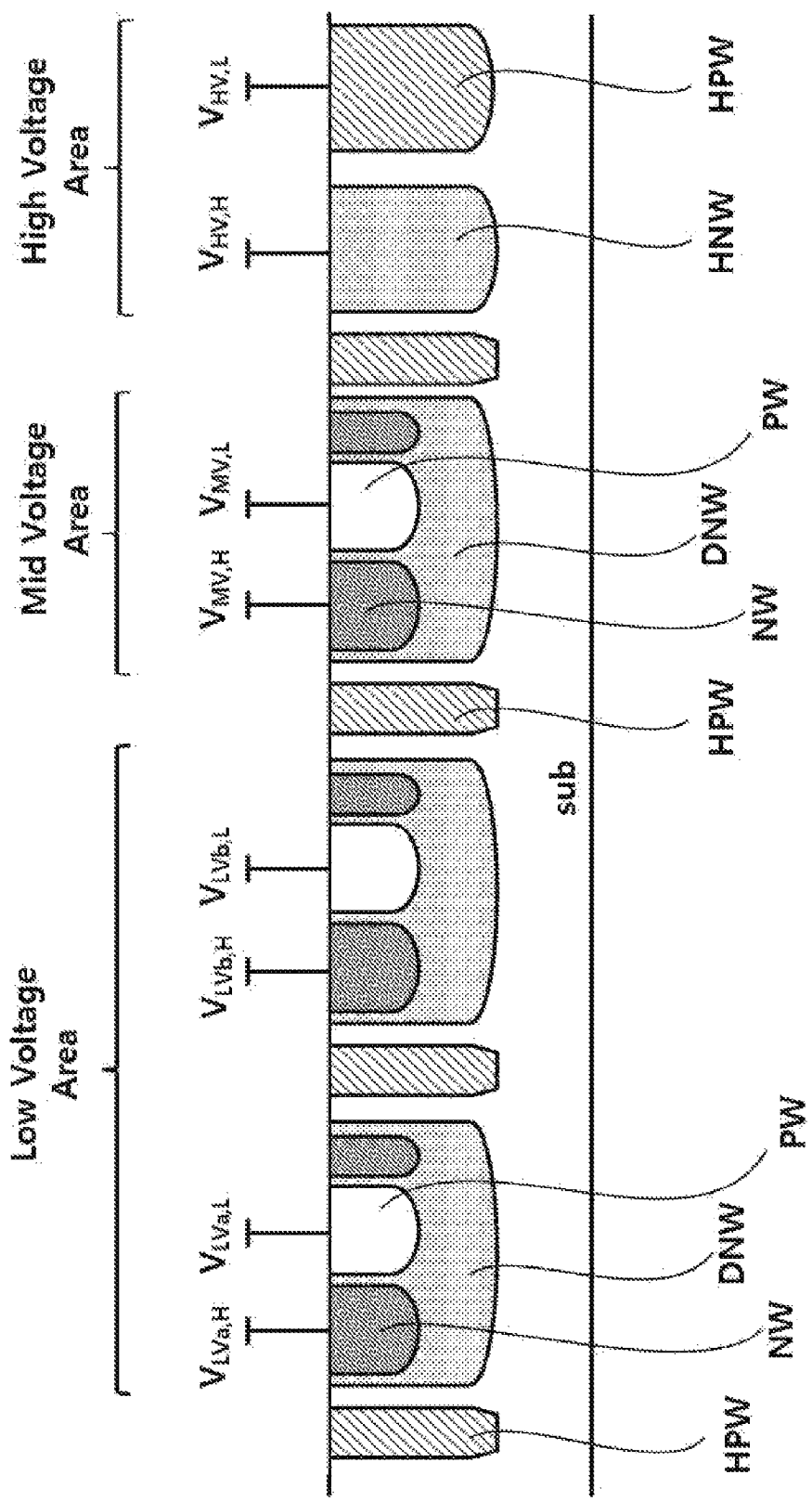
FIG. 3 is a schematic diagram illustrating a cross-sectional view of a silicon substrate in which a source driver according to an embodiment of the present invention is formed.

FIG. 3 is a schematic diagram illustrating a cross-sectional view of a silicon substrate in which a source driver according to an embodiment of the present invention is formed. The source driver 10 may be formed in a semiconductor substrate sub. According to an example shown in FIG. 3, the semiconductor substrate sub may be doped by a P-type dopant. The semiconductor substrate may be divided into a plurality of areas. As an example, circuits operating at a relatively low voltage such as digital circuits or the like may be formed in a low voltage area. A power unit (refer to power in FIG. 1) supplying power to a circuit may be formed in a high voltage area, and circuits operating at a middle voltage area between the low voltage area and the high voltage area may be arranged in the middle voltage area.

In this specification, a low voltage, a high voltage, and a middle voltage may be divided based on a relative amplitude of an input voltage and an output voltage which are provided to and from each of the areas. Accordingly, the content of the invention is not diluted by the terms of the high voltage, the middle voltage, and the low voltage.

The low voltage area and the middle voltage area may be formed to have a triple well structure. The triple well structure may include a deep N-well (DNW) formed in a P-type substrate, an N well (NW) in which a P-type metal oxide semiconductor (PMOS) transistor is arranged in the DNW, and a P well (PW) in which an N-type MOS (NMOS) transistor is arranged in the DNW. According to an embodiment of the triple well, which is not shown, the triple well structure may have a structure in which the PW is formed in the DNW and the NW, in which the PMOS transistor is arranged, is formed in the PW.

A driving voltage that is less than a voltage provided to the high voltage area and the middle voltage area may be supplied to a circuit arranged in the low voltage area. According to the embodiment shown in FIG. 3, the low voltage area may be divided into an area in which a circuit driven by a pair of first driving voltages $V_{LVa,H}$ and $V_{LVa,L}$ is arranged and an area in which a circuit driven by a pair of second driving voltages $V_{LVb,H}$ and $V_{LVb,L}$ is arranged. The NW and the PW in the area in which the circuit driven by the pair of first driving voltages $V_{LVa,H}$ and $V_{LVa,L}$ is arranged may be respectively biased by the pair of first driving voltages $V_{LVa,H}$ and $V_{LVa,L}$, and the area in which the circuit driven by the pair of second driving voltages $V_{LVb,H}$ and $V_{LVb,L}$ is arranged may be respectively biased by the pair of second driving voltages $V_{LVb,H}$ and $V_{LVb,L}$. As an example, the pair of first driving voltages $V_{LVa,H}$ and $V_{LVa,L}$ may respectively be 1.2V and 0V, and the second driving voltage pair $V_{LVb,H}$, $V_{LVb,L}$ may respectively be 1.8V and 0V. According to another embodiment, which is not shown, a circuit driven by a single voltage may be arranged in the low voltage area.

A high voltage N well (HNW) and a high voltage P well (HPW) may be arranged in the high voltage area. A PMOS device and an NMOS device formed to have a great area having a greater channel length and channel width than devices arranged in the low voltage area may be arranged in the HNW and the HPW so as not to be destroyed at the high voltage. High driving voltages $V_{HV,H}$ and $V_{HV,L}$ may be respectively provided to the HNW and the PNW included in the high voltage area. As an example, the high driving voltages $V_{HV,H}$ and $V_{HV,L}$ may respectively be 10V and −10V.

The middle voltage area may have a triple well structure, and a PMOS device and an NMOS device may be respectively arranged in an NW and a PW included in the triple well structure. Middle driving voltages $V_{MV,H}$ and $V_{MV,L}$ may be provided to drive a circuit arranged in the middle voltage area. Further, the middle driving voltages $V_{MV,H}$ and $V_{MV,L}$ may be respectively provided to bias the NW and the PW. According to an embodiment of the present invention, the middle driving voltage $V_{MV,H}$ may be a voltage which is greater than the low voltage driving voltages $V_{LVa,H}$ and $V_{LVb,H}$ and is less than or equal to the high driving voltage $V_{HV,H}$, and the middle driving voltage $V_{MV,L}$ may be a voltage which is not 0V.

As an example, when the gamma voltage is 8V to 2V, the middle driving voltage $V_{MV,H}$ may be 8V, which is an upper limit voltage of the gamma voltage, and the middle driving voltage $V_{MV,L}$ may be 2V, which is a lower limit voltage of the gamma voltage. As another example, when the gamma voltage is 8V to 2V, the middle driving voltage $V_{MV,H}$ may be 8.5V, which is a voltage in which an upper headroom voltage is added to the upper limit voltage of the gamma voltage, and the middle driving voltage $V_{MV,L}$ may be 1.5V, which is a voltage in which a lower headroom voltage is subtracted from the lower limit voltage of the gamma voltage.

Figure 4:
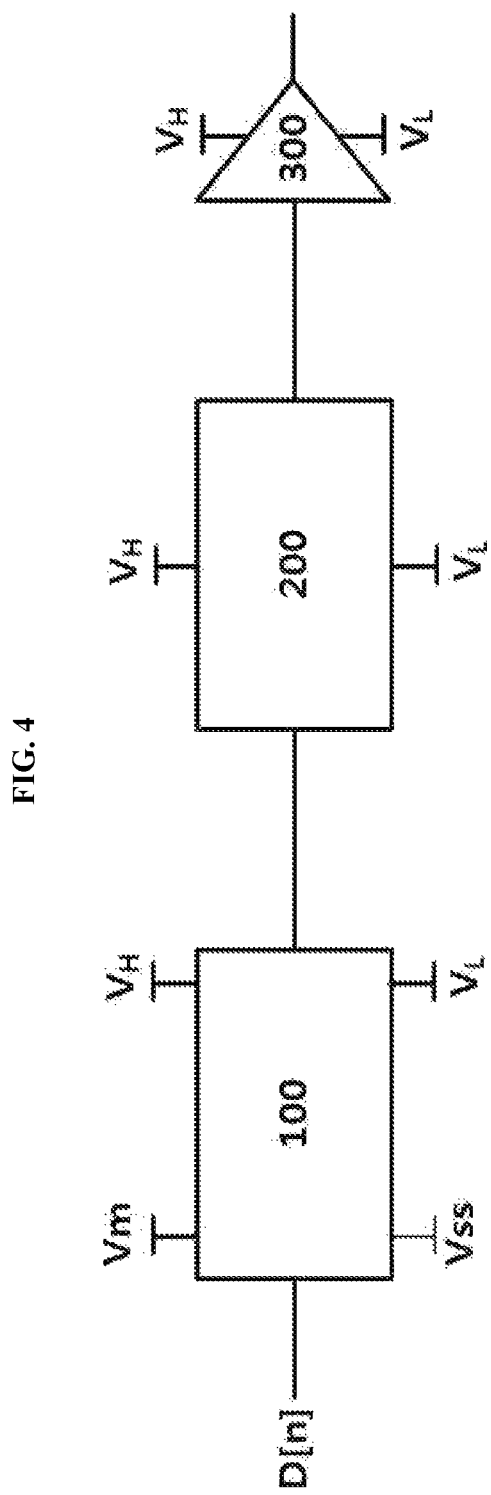
FIG. 4 is a schematic diagram illustrating a portion of a source driver channel according to an embodiment of the present invention.

FIG. 4 is a schematic diagram illustrating a portion of a channel in a source driver channel according to an embodiment of the present invention that receives a digital signal D[n] and forms a gradation voltage $V_{out}$ corresponding to the digital signal to provide the gradation voltage to a pixel. Referring to FIG. 4, a source driver according to an embodiment of the present invention may include the level shifter 100, the DAC 200, and the buffer amplifier 300. The level shifter 100 may receive the digital signal D[n] provided from the S/H register, convert the digital signal D[n] into a signal having a sufficient swing which is able to drive the DAC 200, and provide the converted signal to the DAC 200.

The DAC 200 may receive the digital signal provided from the level shifter 100, form the gradation voltage corresponding to the digital signal, and provide the formed gradation voltage to the buffer amplifier 300. The buffer amplifier 300 may receive the gradation voltage $V_{out}$ provided from the DAC 200 and provide the gradation voltage $V_{out}$ to a pixel included in the display panel to drive the pixel. As an example, the amplifier may be a buffer 300 having unity gain.

In the embodiment shown in FIG. 4, the level shifter 100, the DAC 200, and the buffer amplifier 300 may be operated by the same upper limit voltage $V_H$ and the same lower limit voltage $V_L$, and as an example, the upper limit voltage $V_H$ and the lower limit voltage $V_L$ may respectively be a maximum voltage and a minimum voltage of the gamma voltage. As another example, the upper limit voltage $V_H$ and the lower limit voltage $V_L$ may respectively be the voltage in which the upper headroom voltage is added to the maximum voltage of the gamma voltage and the voltage in which the lower headroom voltage is subtracted from the lower limit voltage of the gamma voltage.

The source driver according to an embodiment of the present invention may output a signal swinging between the upper limit voltage $V_H$ and the lower limit voltage $V_L$ which is greater than 0V. In a source driver according to a conventional art, as an example, the source driver may be formed using a device having an 8V enduring voltage by calculating the enduring voltage on the basis of a ground voltage in order to secure reliability according to the enduring voltage and easily design a circuit even when the upper limit voltage $V_H$ and the lower limit voltage $V_L$ for driving the source driver respectively are 8V and 2V and thus a maximum voltage difference between electrodes of the device included in the source driver is 6V.

However, in the source driver according to an embodiment of the present invention, the level shifter 100, the DAC 200, and the buffer amplifier 300 may be formed using a device having an enduring voltage corresponding to a voltage difference of the upper limit voltage $V_H$ and the lower limit voltage $V_L$. As described above, when the source driver is operated between the upper limit voltage $V_H$ of 8V and the lower limit voltage $V_L$ of 2V, the level shifter 100, the DAC 200, and the buffer amplifier 300 may be formed using a device having a 6V enduring voltage. A die size needed for forming the source driver may be decreased since a device having a low enduring voltage is used, and thus the source driver may be more economically formed.

Hereinafter, embodiments of the level shifter 100, the DAC 200, and the buffer amplifier 300 included in the source driver according the embodiment of the present invention will be described.

Figure 5:
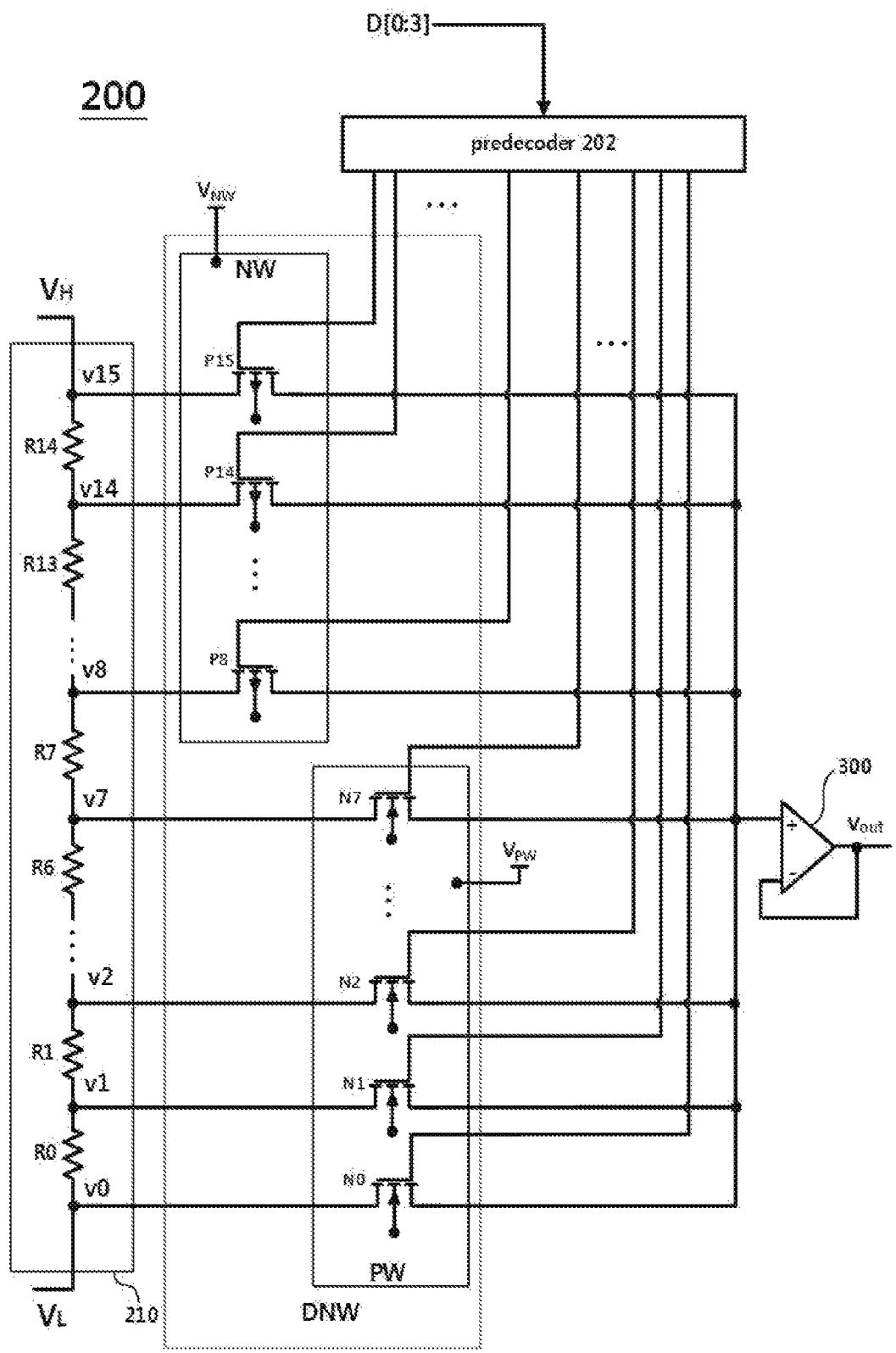
FIG. 5 is a schematic diagram for describing a digital-to-analog converter according to an embodiment of the present invention.

FIG. 5 is a schematic diagram for describing the DAC 200 according to an embodiment of the present invention. Although a configuration which receives a 4-bit digital input D[0:3] through a predecoder and outputs the gradation signal $V_{out}$ corresponding to the 4-bit digital input D[0:3] is illustrated, this configuration is merely an example for clearly describing the present invention and does not limit the technical scope of the present invention, and those of ordinary skill in the art should understand that a DAC having a tree form without a predecoder may be used to satisfy the technical scope of the present invention.

Referring to FIG. 5, the DAC 200 according to an embodiment of the present invention may include a resistor string 210 in which a plurality of resistors R0, R1, . . . , and R14 are connected, and NMOS pass transistors N0, N1, N2, . . . , and N7 in which gradation voltages v0, v1, . . . , and v7 formed by the upper limit voltage $V_H$ and the lower limit voltage $V_L$ being received through one end and the other end of the resistor string 210 are provided to drain electrodes, which are controlled by control signals provided to control gate electrodes, and in which the gradation voltages are output to source electrodes, and the plurality of NMOS transistors may be arranged in a PW, body electrodes of the NMOS transistors and the PW may be electrically connected, and the NMOS transistors may be biased by a P well bias voltage $V_{PW}$.

As an embodiment, the upper limit voltage $V_H$ and the lower limit voltage $V_L$ may respectively be the maximum voltage and the minimum voltage of the gamma voltage. As another embodiment, the upper limit voltage $V_H$ and the lower limit voltage $V_L$ may respectively be the voltage in which the upper headroom voltage is added to the maximum voltage of the gamma voltage and the voltage in which the lower headroom voltage is subtracted from the lower limit voltage of the gamma voltage.

The DAC 200 may include a plurality of PMOS transistors P8, . . . , P14, and P15 in which gradation voltages v8, v9, . . . , and v15 are provided to source electrodes, control signals provided from the predecoder are provided to gate electrodes, and gradation voltages corresponding to the control signals are output to drain electrodes. The plurality of PMOS transistors may be arranged in the NW, body electrodes of the PMOS transistors and the NW may be electrically connected, and the plurality of the PMOS transistors may be biased by an N well bias voltage $V_{NW}$.

The NW and the PW may be formed in a DNW having a single form or a divided form. As an embodiment, when a circuit which receives a high voltage or provides a high voltage is not needed, the NW may be formed as the DNW.

As an embodiment, the gradation voltages may be formed by being divided into a high gradation voltage group and a low gradation voltage group, and pass transistors providing the high gradation voltage group may be implemented using PMOS pass transistors, and pass transistors providing the low gradation voltage group may be implemented using NMOS pass transistors. As an example, pass transistors outputting the gradation voltages v8 to v15 may be implemented using PMOS transistors, and pass transistors outputting the gradation voltages v0 to v7 may be implemented using NMOS transistors. The NMOS pass transistors may be arranged in the PW in the triple well structure, body electrodes of the NMOS transistors may be biased by the P well bias voltage $V_{PW}$, the PMOS transistors may be arranged in the NW in the triple well structure, and the body electrodes of the PMOS transistors may be biased by the N well bias voltage $V_{NW}$. Like the embodiment shown in FIG. 5, the number of the gradation voltages included in the high gradation voltage group may be equal to the number of the gradation voltages included in the low gradation voltage group. As another embodiment, which is not shown, the number of the gradation voltages included in the high gradation voltage group may be different from the number of the gradation voltages included in the low gradation voltage group.

The resistor string 210 may include the plurality of resistors R0, R1, . . . , R14, and the upper limit voltage $V_H$ may be provided to one end thereof, and the lower limit voltage $V_L$ □may be supplied to the other end thereof. As an example, the upper limit value and lower limit voltage may be the gamma voltage in which a value is changed according to the display panel (refer to display panel in FIG. 1). As another example, the upper limit value may be a voltage value in which a positive headroom voltage is added to the upper limit value of the gamma voltage, and the lower limit value may be a voltage value in which a negative headroom voltage is added to the lower limit value of the gamma voltage. The plurality of gradation voltages v0, v1, . . . , v15 may be generated when the upper limit voltage $V_H$ and the lower limit voltage $V_L$ are provided to the resistor string 210. The generated gradation voltages may be provided to the pixel of the display panel.

In the embodiment shown in FIG. 5, an example in which the lower limit voltage $V_L$ is v0, which is the smallest gradation voltage, is illustrated, but one or more resistors may be present between a node to which the lower limit voltage $V_L$ is provided and a node to which the smallest gradation voltage v0 is provided, and voltage values of the lower limit voltage $V_L$ and the smallest gradation voltage v0 may be different. Further, an example in which the upper limit voltage $V_H$ is v15, which is the greatest gradation voltage, is illustrated, but the upper limit voltage $V_H$ and the greatest gradation voltage v15 may be different.

As an embodiment, differences between adjacent gradation voltages may be uniformized by the plurality of resistors being formed to have the same value. As another embodiment, since brightness and a gradation voltage of an image displayed on a display are in a nonlinear relationship, the plurality of resistors may be formed to have different values, and differences of adjacent gradation voltages may be different.

The DAC 200 may include the predecoder 202 which receives and decodes level-shifted input bits D [0:3]. The predecoder 202 may control the PMOS pass transistors P8, P9, . . . , P15, and the NMOS pass transistors N0, N1, . . . , N7 in order to receive the input bits D[0:3] and output any one among the gradation voltages v0 to v15 corresponding to the input bits D[0:3]. As an embodiment, the P well bias voltage $V_{PW}$ may be the smallest voltage among the gradation voltages provided by the pass transistors included in the PW. As another embodiment, the lower limit voltage $V_L$ may be provided as the P well bias voltage $V_{PW}$.

An NW in which the PMOS pass transistors are arranged may be biased by the N well bias voltage $V_{NW}$, and the body electrodes of the PMOS pass transistors may be electrically connected to the NW. As an embodiment, the N well bias voltage $V_{NW}$ provided to the NW may be the greatest voltage among the gradation voltages provided by the PMOS transistors arranged in the NW. As another embodiment, the upper limit voltage $V_H$ may be provided as the N well bias voltage $V_{NW}$ provided to the NW.

The predecoder 202 may generate the control signals swinging between the upper limit voltage $V_H$ and the lower limit voltage $V_L$ to control the PMOS pass transistors and the NMOS pass transistors. As an example, assume that the upper limit voltage $V_H$ is 8V, the lower limit voltage $V_L$ is 2V, a threshold voltage of the PMOS pass transistor is −0.3V, and a threshold voltage of the NMOS transistor is 0.3V. The predecoder 202 may generate control signals swinging between 2V and 8V and control the pass transistors.

As an example, when a control signal of 8V is provided to the gate electrode of the PMOS transistor P15, the PMOS transistor P15 may be turned off since a gate-source voltage is 0V and is greater than −0.3V, which is the threshold voltage thereof. However, when a 2V voltage is provided as the control signal, the PMOS transistor P15 may be turned on since the gate-source voltage is −6V and is less than −0.3V, which is the threshold voltage. Further, when the control signal of 8V is provided to the gate electrode of the NMOS pass transistor N0, the NMOS pass transistor N0 may be turned on since a gate-source voltage is 6V and is greater than 0.3V, which is the threshold voltage thereof. However, when a 2V voltage is provided as the control signal, the NMOS pass transistor N0 may be turned off since the gate-source voltage is 0V and is less than the threshold voltage. As described above, since the predecoder controls the NMOS pass transistors N0, N1, . . . , N7 and the PMOS pass transistors P8, P9, . . . , P15 using the control signal having the same swing, a circuit configuration of the decoder may be simplified.

In the embodiment shown in FIG. 5, an example in which the lower limit voltage $V_L$ is provided as v0, which is the smallest gradation voltage, and the upper limit voltage $V_H$ is provided as v15, which is the greatest gradation voltage, is illustrated, but one or more resistors may be present between a node to which the lower limit voltage $V_L$ is provided and a node to which the smallest gradation voltage v0 is provided so that the lower limit voltage $V_L$ and the smallest gradation voltage v0 may be different and/or the upper limit voltage $V_H$ and the greatest gradation voltage v15 may be different.

The predecoder 202 may form a signal swinging between any one of the upper limit voltage $V_H$ and the greatest gradation voltage among the gradation voltages and any one of the lower limit voltage $V_L$ and the smallest gradation voltage among the gradation voltages according to need, and control the pass transistors.

In the embodiment shown in FIG. 5, a maximum of 8V may be provided to the gate electrode of the pass transistor N0, 2V may be provided to the drain electrode, and thus a maximum voltage difference between the two electrodes may be 6V. Further, since a minimum of 2V is provided to the gate electrode of the pass transistor P15 and 8V is provided to the source electrode, a maximum voltage difference between the two electrodes may be 6V, and a maximum voltage difference of the electrodes may also be 6V in the NMOS pass transistors N1 to N7 and the PMOS pass transistors P9 to P15. Accordingly, the DAC may be implemented using a device having the 6V enduring voltage.

In a DAC according to the conventional art, a maximum voltage difference between electrodes of devices may be calculated based on a ground voltage in a circuit which includes the device in order to easily design the circuit and secure an enduring voltage thereof. Accordingly, in the above-described embodiment, the voltage difference between the electrodes of the pass transistor may be recognized from 0V, which is the ground voltage, and thus the pass transistors of the DAC may be designed using the device having the 8V enduring voltage. Accordingly, devices used in the circuit may be designed to have a great size so as to be able to endure a voltage greater than a voltage which is actually applied.

However, according to the embodiment of the present invention, the voltage difference between the electrodes may be decreased by providing a well bias voltage to the body electrode, and thus a device having a much smaller enduring voltage may be used. Accordingly, a device having a small size may be used without any reliability problems, and the circuit may be designed in a small area.

Figure 6:
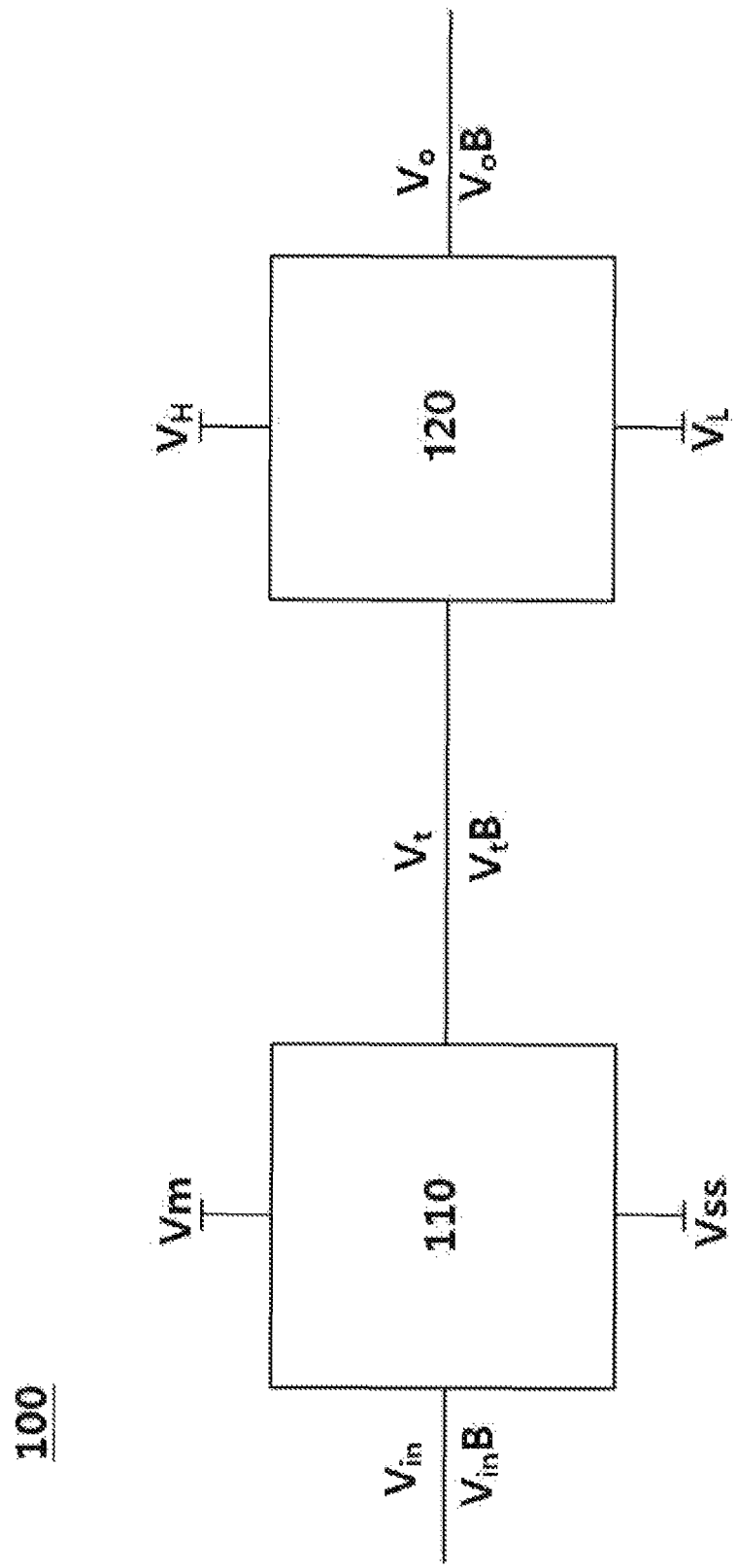
FIG. 6 is a schematic block diagram illustrating a level shifter that provides a gate driving signal of a decoder according to an embodiment of the present invention.

FIG. 6 is a schematic block diagram illustrating the level shifter 100 that provides a gate driving signal of a decoder according to an embodiment of the present invention. Referring to FIG. 6, the level shifter 100 according to an embodiment of the present invention may include a first level shifter module 110 that receives input signals $V_{in}$ and $V_{in}B$ and outputs output signals $V_t$ and $V_tB$ swinging between a middle voltage Vm and a reference voltage $V_{SS}$, and a second level shifter module 120 that outputs control signals $V_o$ and $V_oB$ swinging between the upper limit voltage $V_H$ and the lower limit voltage $V_L$ so as to correspond to the input signals $V_{in}$ and $V_{in}B$, and the second level shifter module 120 may include NMOS transistors Na and Nb, and the lower limit voltage may be provided to source electrodes and body electrodes of the NMOS transistors. As an example, the upper limit voltage $V_H$ may be a voltage greater than an upper limit voltage of the gradation voltages, and the lower limit voltage $V_L$ may be a voltage less than a lower limit voltage of the gradation voltages.

The predecoder (refer to 202 in FIG. 5) driving the pass transistors may decode a signal provided from the level shifter 100 while maintaining a level of the signal, and may provide the decoded signal to the gate electrodes of the pass transistors. Accordingly, the level shifter 100 may shift the input signal provided from the S/H register into a voltage level which is able to turn on/off the NMOS pass transistor and the PMOS pass transistor, and provide the level-shifted signal to the predecoder.

In an embodiment, the level shifter 100 may output two levels, which are the upper limit voltage $V_H$ having a voltage level which turns on the NMOS pass transistors (the PMOS pass transistors are turned off) and the lower limit voltage $V_L$ having a voltage level which turns off the NMOS pass transistors (the PMOS pass transistors are turned on), and control the pass transistors, and thus the level shifter and the driving circuit of the predecoder may be simplified.

When configuring the level shifter 100 to have a single stage, it may be difficult for the S/H register (refer to FIG. 2) to drive the level shifter since a level of the output signal of the S/H register are small. Accordingly, the first level shifter module 110 which is able to be driven by the output signal of the S/H register may be configured, the second level shifter module 120 may be driven using an output signal of the first level shifter module 110 and thus the level shifter 100 may be driven by the output signal of the S/H register.

Figure 7:
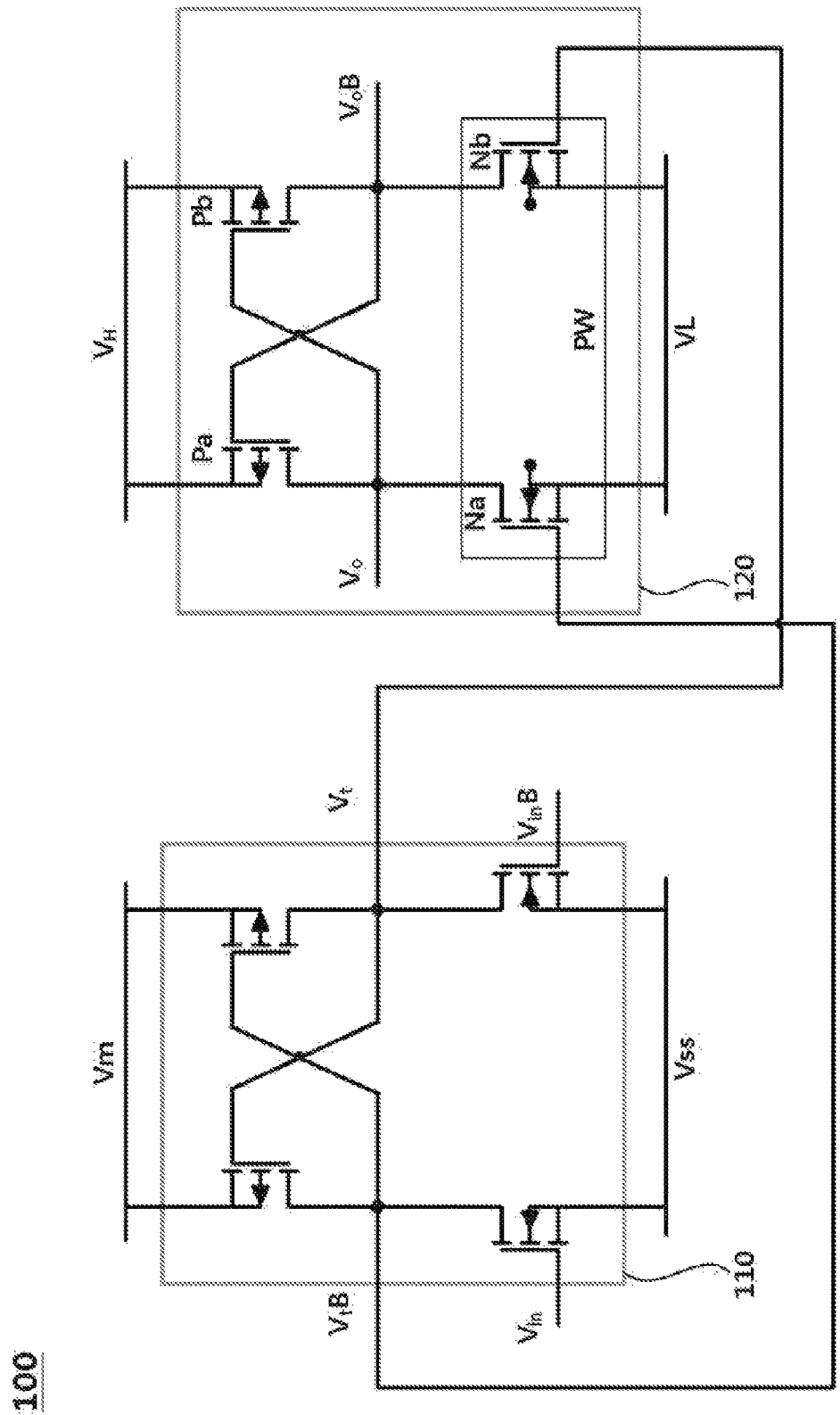
FIG. 7 is a schematic circuit diagram illustrating an example of a first level shifter module and a second level shifter module implemented using cross-coupled inverters.

FIG. 7 is a schematic circuit diagram illustrating an example of the first level shifter module 110 and the second level shifter module 120 being implemented using cross-coupled inverters. This is merely an example of a configuration capable of implementing the level shifter, and is not intended to limit the scope of the present invention. Referring to FIG. 7, the first level shifter module 110 may receive the input signals $V_{in}$ and $V_{in}B$ and provide the pair of output signals $V_t$ and $V_tB$ generated by inverting the input signals. Like the embodiment shown in FIG. 5, the first level shifter module 110 may include a differential pair and be differentially operated, and although not shown, the first level shifter module 110 may be a single ended inverter.

The input signals $V_{in}$ and $V_{in}B$ provided to the first level shifter module 110 may be digital signals provided from the S/H register, and a level of the input signals may be small to drive the level shifter 100. Accordingly, the first level shifter module 110 may be driven by the digital signal provided from the S/H register to drive the second level shifter module 120. As an example, the output signal of the first level shifter module 110 may have a signal swinging between the reference voltage $V_{SS}$, which is the ground voltage, and the middle voltage Vm, which is sufficient to drive the second level shifter module 120.

The second level shifter module 120 may output the pair of control signals $V_o$ and $V_oB$ that swing between the upper limit voltage $V_H$ and the lower limit voltage $V_L$ in response to the input signals. Like the embodiment shown in FIG. 7, the second level shifter module 120 may include a differential pair and be differentially operated, and although not shown, the second level shifter module 120 may be a single-ended inverter. As an embodiment, the lower limit voltage $V_L$ may be a voltage different from the reference voltage $V_{SS}$ of the first level shifter module 110, and may be a voltage greater than the reference voltage $V_{SS}$.

Body electrodes of the NMOS transistors Na and Nb included in the second level shifter module 120 may be electrically connected to a PW of a triple well structure in which the NMOS transistors Na and Nb are arranged together with source electrodes. The lower limit voltage $V_L$ may be provided to the body electrodes and the source electrodes of the NMOS transistors Na and Nb.

In the embodiment shown, the pair of output signals $V_t$ and $V_tB$ of the first level shifter module 110 may be provided to the gate electrodes of the NMOS transistors Nb and Na. As an embodiment, when the voltage $V_t$ provided to the gate electrode of the NMOS transistor Nb turns on the NMOS transistor Nb, the lower limit voltage $V_L$ may be output as the signal $V_oB$, and a PMOS transistor Pa may be turned on since the lower limit voltage $V_L$ is provided to a gate electrode of the PMOS transistor Pa. Accordingly the upper limit voltage $V_H$ may be output as a signal $V_o$. Conversely, when the signal $V_t$ provided to the gate electrode of the NMOS transistor Na turns on the NMOS transistor Na, the lower limit voltage $V_L$ may be output as the signal $V_o$, and a PMOS transistor Pb may be turned on since the lower limit voltage $V_L$ is provided to a gate electrode of the PMOS transistor Pb. Accordingly, the upper limit voltage $V_H$ may be output as the signal $V_oB$. As an embodiment, a lower limit voltage of the pair of control signals $V_o$ and $V_oB$ output by the second transistor may be controlled by controlling a voltage provided to a PW in which the NMOS transistors Na and Nb are arranged.

When a signal having the reference voltage $V_{SS}$, which is the ground voltage of the first level shifter module 110, is provided to the gate electrodes of the NMOS transistors Na and Nb included in the second level shifter module 120, the NMOS transistors Na and Nb may be turned off. When the middle voltage Vm of the first level shifter module 110 is set to be a voltage which is able to turn on the NMOS transistors Na and Nb included in the second level shifter module 120, a signal swinging between the upper limit voltage $V_H$ and the lower limit voltage $V_L$ may be output by controlling the second level shifter module 120 using the pair of output signals $V_t$ and $V_tB$ of the first level shifter module 110.

As described above, the upper limit voltage $V_H$ may be a voltage which is able to control the NMOS pass transistor to be turned on by being provided to the gate electrode of the NMOS pass transistor, and the lower limit voltage $V_L$ may be a voltage which is able to control the PMOS pass transistor to be turned on by being provided to the gate electrode of the PMOS pass transistor. As an example, the upper limit voltage may be more than and equal to the maximum value of the gradation voltages by at least the threshold voltage of the pass transistor, and the lower limit voltage may be a voltage which is less than and equal to the minimum value of the gradation voltages by at least the threshold voltage of the pass transistor.

In the embodiment shown in FIG. 7, when the reference voltage $V_{SS}$ is the ground voltage, the maximum voltage difference of the electrodes may be $V_H$ in the second level shifter module 120 since the minimum voltage of the pair of output signals $V_t$ and $V_tB$ is the reference voltage $V_{SS}$ and the drain voltages of the NMOS transistors Na and Nb of the second level shifter module 120 are the upper limit voltage $V_H$. Accordingly, when the second level shifter module 120 is formed using devices having an enduring voltage of $V_H$-$V_L$, which is a difference between the upper limit voltage $V_H$ and the lower limit voltage $V_L$, the transistors may be destroyed or may not be operated reliably due to deviation from the enduring voltage of the transistors, and thus operating reliability may be secured by the NMOS transistors Na and Nb being formed using devices operating at the maximum voltage difference of the electrodes $V_H$. However, the devices having the enduring voltage of $V_H$-$V_L$ may be used since a voltage which is smaller than the lower limit voltage $V_L$ is not provided to the PMOS transistors Pa and Pb included in the second level shifter module 120.

Figure 8:
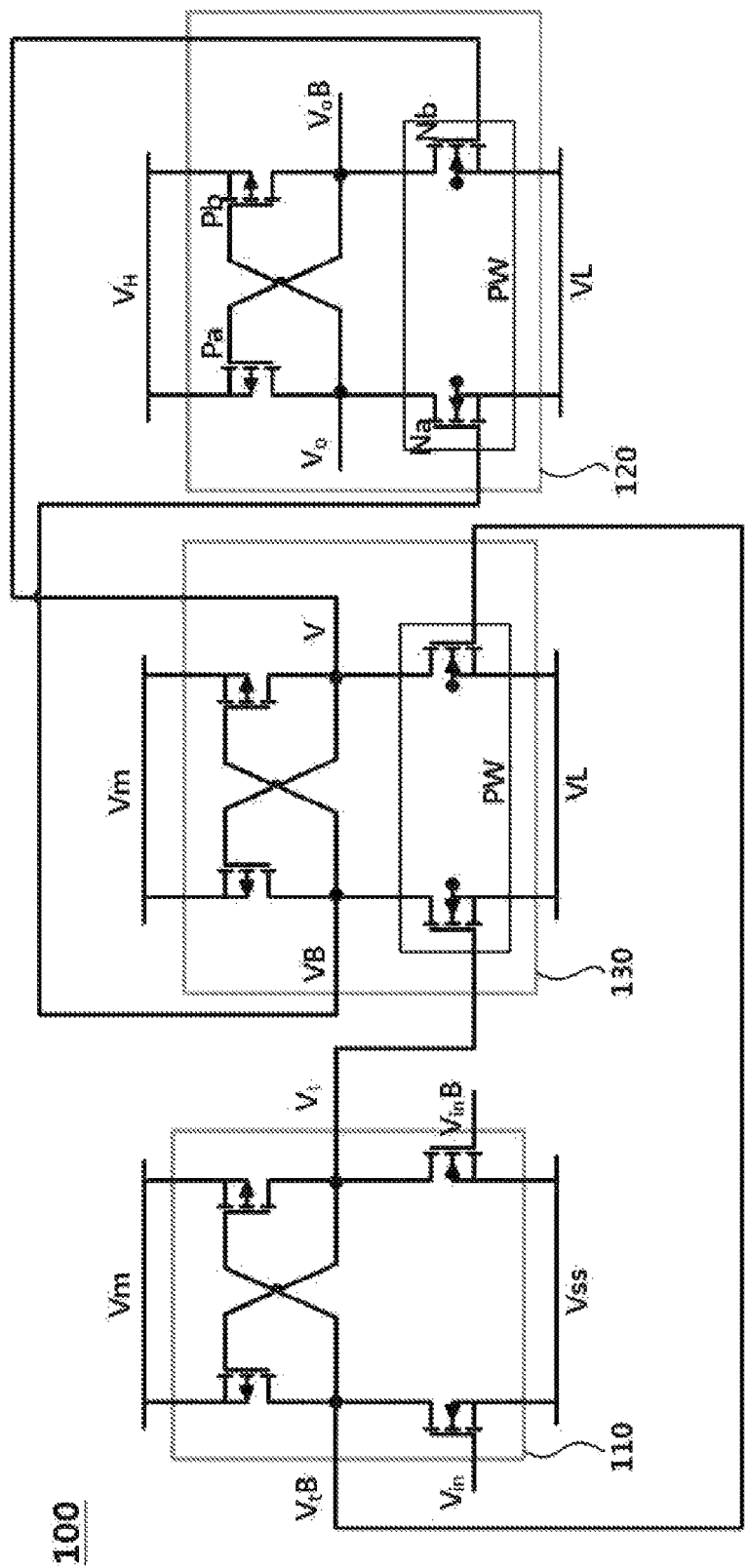
FIG. 8 is a schematic circuit diagram illustrating an example in which one or more level shifter module stages are further connected between a first level shifter module stage and a second level shifter module stage.

Like an embodiment shown in FIG. 8, one or more level shifter module stages may be further connected between the first level shifter module 110 stage and the second level shifter module 120 stage. A third level shifter module 130 may receive the output signals $V_t$ and $V_tB$ provided from the first level shifter module 110, and provide output signals V and VB swinging between the middle voltage Vm and the lower limit voltage $V_L$. Accordingly, a lower limit voltage of the output signals V and VB output to the second level shifter module 120 may not be the reference voltage $V_{SS}$, but may be the lower limit voltage $V_L$. Accordingly, a swing width of the signal provided to the second level shifter module 120 may be decreased, and the NMOS transistors Na and Nb included in the second level shifter module 120 may be formed using the devices having the enduring voltage of $V_H$-$V_L$. Therefore, the NMOS transistors Na and Nb may be formed using devices having a smaller enduring voltage than the embodiment shown in FIG. 7.

In a level shifter according to the conventional art, as an example, devices using an 8V voltage difference between electrodes have been used in order to easily design a circuit even when an operation of shifting an input signal into a signal swinging between 8V and 2V is performed. However, in the level shifter according to an embodiment of the present invention, the body electrodes of the NMOS transistors may be biased by the lower limit voltage of the output signal of the level shifter. Accordingly, the voltage difference of the electrodes of the NMOS transistors may be decreased, and a level shifter having a smaller area than that of the conventional art may be implemented.

Figure 9:
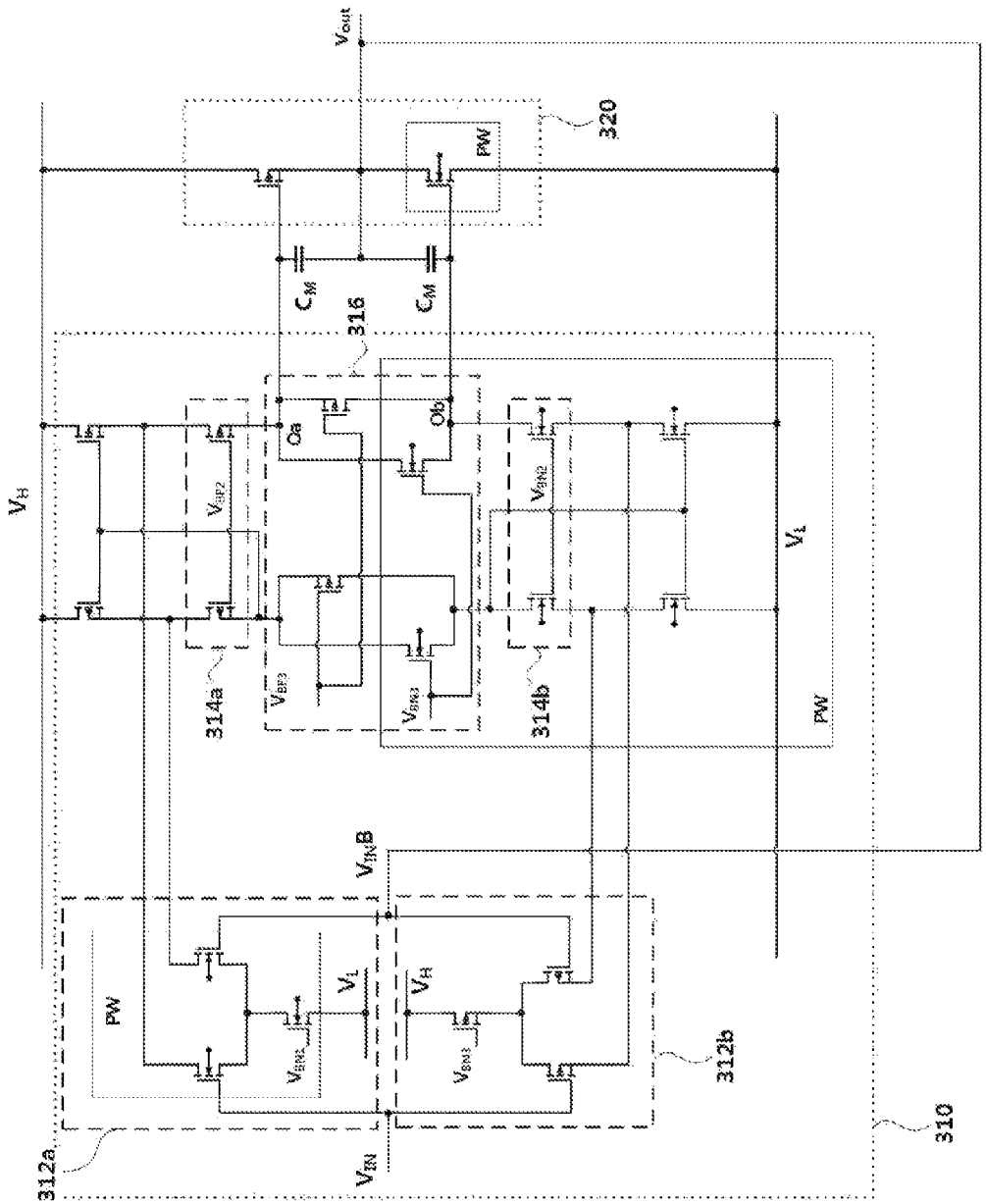
FIG. 9 is a schematic circuit diagram illustrating one implementation example of a buffer amplifier according to an embodiment of the present invention.

FIG. 9 is a schematic circuit diagram illustrating one implementation example of the buffer amplifier 300 according to an embodiment of the present invention. Referring to FIG. 9, the buffer amplifier 300 according to an embodiment of the present invention may be a buffer amplifier including an operational amplifier in which an output is negatively fed back to an input, and the operational amplifier may include a first stage 310 including a folded cascode pair 312 and 314 and a level converter 316 converting levels of output signals of the folded cascode pair 312 and 314, and a second stage 320 including a class AB amplifier which amplifies the output signal of the first stage, and the first stage and the second stage may be cascaded and connected, and the operational amplifier may operate between the upper limit voltage $V_H$ and the lower limit voltage $V_L$.

An NMOS input circuit 312a may receive an input voltage increasing up to the upper limit voltage $V_H$, and a PMOS input circuit 312b may receive an input voltage decreasing down to the lower limit voltage $V_L$. Accordingly, the input signal provided to the first stage 310 may swing between the upper limit voltage $V_H$ and the lower limit voltage $V_L$. Further, an output resistance characteristic of the first stage 310 may be improved by cascode circuits 314a and 314b, and a gain of the first stage 310 may be larger than when the cascode circuits are not applied.

The level converter 316 may convert levels of bias voltages so that a rush current is not generated from the upper limit voltage to the lower limit voltage as an NMOS transistor and a PMOS transistor included in the second stage 320 are simultaneously turned on, and provide the converted bias voltages to output nodes thereof. As an example, the level converter 316 may receive a bias voltage $V_{BP3}$, convert a level of the bias voltage $V_{BP3}$ by as much as a level corresponding to a gate-source voltage difference of the PMOS transistor, provide the converted bias voltage to an output node Oa, receive a bias voltage $V_{BN3}$, convert a level of the bias voltage $V_{BN3}$ by as much as a level corresponding to a gate-source voltage difference of the NMOS transistor, and provide the converted bias voltage to an output node Ob.

The cascode circuits 314a and 314b may respectively provide signals, which are generated by amplifying an input signal, to the output nodes Oa and Ob of the level converter 316. Accordingly, a signal generated by providing the input signals $V_{IN}$ and $V_{IN}B$ to the first stage may be provided as the input of the second stage by being overlapped with the converted bias voltage so that the PMOS transistor and the NMOS transistor included in the second stage are not simultaneously turned on. The second stage 320 may include the class AB amplifier, receive the input signals provided through the output nodes Oa and Ob, and provide the output signal swinging between the upper limit voltage $V_H$ and the lower limit voltage $V_L$. Since an output signal $V_{out}$ of the operational amplifier is fed back as the inverted input signal $V_{IN}B$, a buffer amplifier having unity gain may be formed.

In an embodiment, frequency compensation capacitors $C_M$ may be further included between the first stage and the second stage. The frequency compensation capacitors CM may be connected between the inputs and the output of the second stage. The frequency compensation capacitors CM connected between the inputs and the output of the amplifier may degrade a frequency-gain characteristic, but may perform a function of removing a parasitic oscillation occurring at a high frequency by improving a frequency margin characteristic.

The NMOS transistors included in the first stage 310 and the second stage 320 may be arranged in the PW of the triple well structure. The PW may be biased by the lower limit voltage $V_L$, and body electrodes of the NMOS transistors arranged in the PW may be electrically connected to the PW and receive a well bias voltage therefrom.

In a buffer amplifier according to the conventional art, a ground voltage has been provided as a minimum voltage provided to devices used as an amplifier in order to easily design a circuit and secure an enduring voltage thereof even when operating between an upper limit voltage and a lower limit voltage which is not the ground voltage, and thus the enduring voltage of the devices may be calculated based on the ground voltage. As an example, even in a buffer amplifier operating with an upper limit voltage of 8V and a lower limit voltage of 2V, devices operating with an 8V voltage difference of electrodes have been used.

However, in the buffer amplifier according to an embodiment of the present invention, the well in which the NMOS transistors are arranged is biased by the lower limit voltage, and the lower limit voltage, which is the well bias voltage, may be provided to the body electrodes of the NMOS transistors which are electrically connected to the well. Accordingly, the voltage difference of the electrodes of the NMOS transistor may be decreased by as much as the well bias voltage provided to the well. That is, in the buffer amplifier operating with the upper limit voltage of 8V and the lower limit voltage of 2V, a voltage difference of the electrodes may be decreased to 6V by providing the 2V lower limit voltage, which is the well bias voltage, to the body electrodes of the NMOS transistors, and a buffer amplifier having a smaller area than that of the conventional art may be implemented using devices having a 6V enduring voltage.

Figure 10:
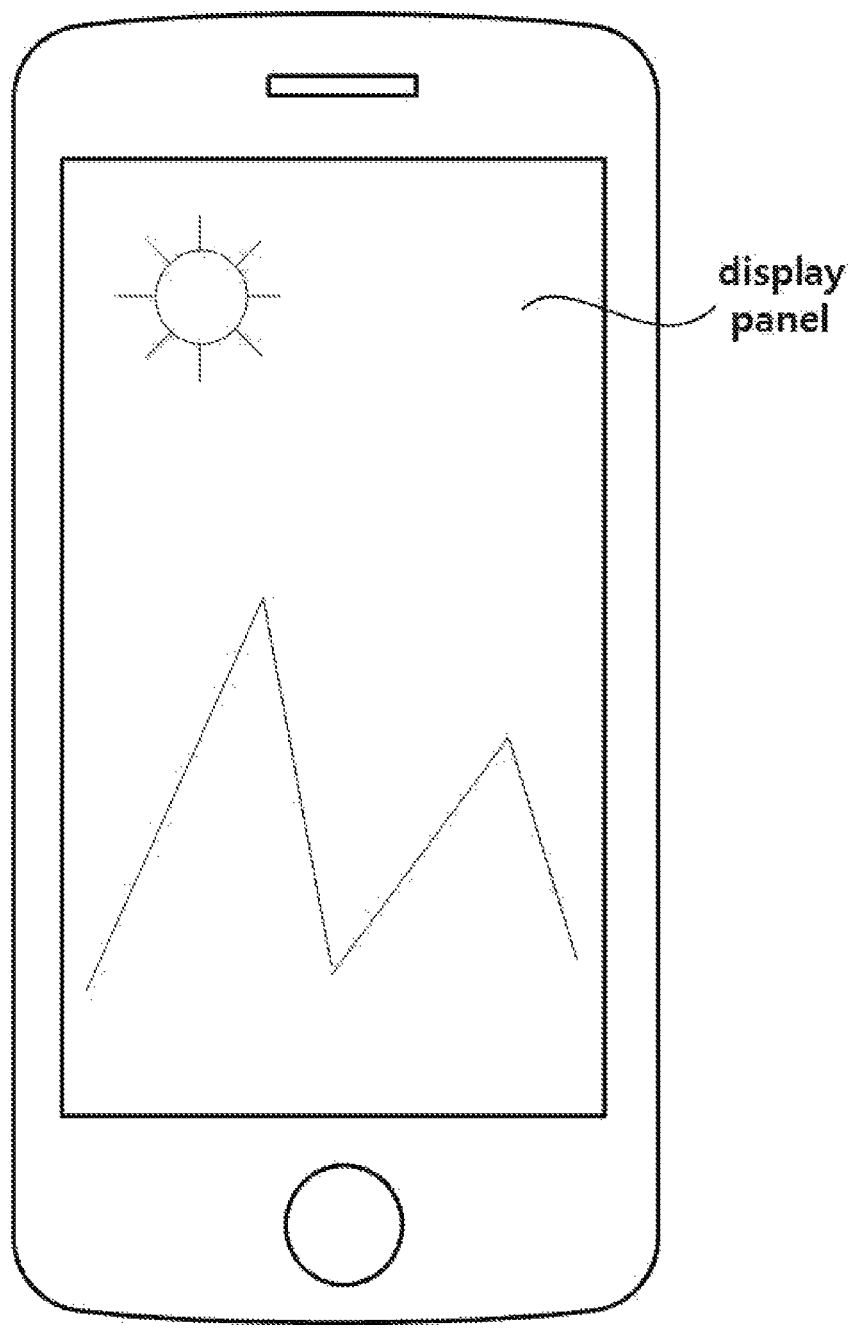
FIG. 10 is a schematic diagram illustrating an electronic device 1 including a source driver 10 according to an embodiment of the present invention.

FIG. 10 is a schematic diagram illustrating an electronic device 1 including the source driver 10 according to an embodiment of the present invention. Hereinafter, for convenience of explanation, the same content as the embodiments described above will be omitted. Referring to FIG. 10, the electronic device 1 according to an embodiment of the present invention may include the source driver 10 including the level shifter 100 which receives digital bits and provides a level-shifted output signal, the DAC 200 including a resistor string that provides a plurality of gradation voltages formed by receiving an upper limit voltage and a lower limit voltage respectively through one end and the other end, and a plurality of switches which are controlled by output signals and output a gradation voltage corresponding to the output signals, and the buffer amplifier 300 which amplifies the signal provided from the DAC 200, wherein the plurality of switches including NMOS switches in which a voltage is provided to body electrodes thereof, and a display panel driven by the source driver 10.

The display panel may be a display panel driven by the source driver 10 and a gate driver (refer to gate driver of FIG. 1). As an example, the display panel may be a liquid crystal display (LCD) panel. The LCD panel may include liquid crystals and transparent electrodes having the liquid crystals therebetween and a polarizing plate. When a voltage is provided to one pair of transparent electrodes, light provided by a backlight unit arranged behind the pair of transparent electrodes is transmitted or blocked since an arrangement of the liquid crystals arranged between the transparent electrodes is changed.

As another example, the display panel may be an organic light emitting device (OLED) display panel. The OLED display panel may include an electron transporting layer transporting an electron between a cathode and an anode which are two electrodes, a hole transporting layer transporting a hole, and a light emitting layer emitting light as the transported electron and hole are recombined, and the OLED display panel may have a characteristic of autonomously emitting light by energy being provided thereto unlike the LCD, which does not autonomously emit light and transmits and blocks light provided from the rear side thereof.

The electronic device 1 according to an embodiment of the present invention may include the level shifter 100, the DAC 200, and the buffer amplifier 300, and may be driven by a voltage between the upper limit voltage $V_H$ and the lower limit voltage $V_L$.

FIG. 10 illustrates an example in which the electronic device 1 is a mobile device, but is merely an example, and the electronic device 1 may be a mobile electronic device including a display panel such as a tablet personal computer (PC), a laptop computer, etc., and may be an electronic device of displaying an image in a fixed position like a television (TV), a computer monitor, etc.

According to the source driver 10, the level shifter 100, the DAC 200, and the buffer amplifier 300 according to an embodiment of the present invention, when devices are driven between the upper limit voltage and the lower limit voltage, which is not 0V, the source driver 10, the level shifter 100, the digital analog converter 200, and the buffer amplifier 300 may be formed using devices having a small size by decreasing an enduring voltage of the devices, unlike in the conventional art. Accordingly, since a die size is decreased, the devices may be economically manufactured in comparison to the conventional art.

According to an embodiment of the present invention, a die size may be decreased by forming a circuit using a smaller device than in the conventional art by decreasing a voltage difference of electrodes of an MOS device. Accordingly, the circuit may be economically manufactured.

While the present invention has been described with reference to embodiments shown in the accompanying drawings in order to facilitate understanding of the present invention, those skilled in the art should understand that the embodiments are merely examples and are merely illustrative, and various modifications and equivalent other embodiments are possible. Accordingly, the technical spirit and scope of the present invention may be defined by the appended claims.

What is claimed is:
1. A digital-to-analog converter, comprising;
 a resistor string in which a plurality of resistors are connected; and
 a plurality of N-type metal oxide semiconductor (NMOS) transistors in which a plurality of gradation voltages formed by an upper limit voltage and a lower limit voltage being received through one end and the other end of the resistor string respectively are provided to drain electrodes, control signals are provided to gate electrodes, and the gradation voltages are output through source electrodes,
 wherein the plurality of NMOS transistors are arranged in a P well, and the P well and body electrodes of the plurality of NMOS transistors are electrically connected and receive a well bias voltage,
 wherein the digital-to-analog converter further comprises a plurality of P-type (PMOS) transistors in which the plurality of gradation voltages are respectively provided to source electrodes, the control signals are provided to control gate electrodes, and the gradation voltages are output through drain electrodes,
 wherein one or more PMOS transistors among the plurality of PMOS transistors are arranged in an N well, and the N well and body electrodes of the one or more PMOS transistors are electrically connected and receive a well bias voltage, and
 wherein the plurality of NMOS transistors arranged in the P well and the plurality of PMOS transistors arranged in the N well have an enduring voltage corresponding to a difference between the upper limit voltage and the lower limit voltage.

2. The digital-to-analog converter of claim 1, further comprising a decoder configured to control the plurality of NMOS transistors and the plurality of PMOS transistors using control signals having the same swing.

3. The digital-to-analog converter of claim 1, wherein the upper limit voltage and the lower limit voltage respectively are a maximum voltage and a minimum voltage of a gamma voltage.

4. A digital-to-analog converter, comprising;
 a resistor string in which a plurality of resistors are connected; and
 a plurality of N-type metal oxide semiconductor (NMOS) transistors in which a plurality of gradation voltages formed by an upper limit voltage and a lower limit voltage being received through one end and the other end of the resistor string respectively are provided to drain electrodes, control signals are provided to gate electrodes, and the gradation voltages are output through source electrodes,
 wherein the plurality of NMOS transistors are arranged in a P well, and the P well and body electrodes of the plurality of NMOS transistors are electrically connected and receive a well bias voltage, and
 wherein the upper limit voltage is a voltage in which an upper headroom voltage is added to the gamma voltage, and the lower limit voltage is a voltage in which a lower headroom voltage is subtracted from the gamma voltage.

5. A digital-to-analog converter, comprising;
 a resistor string in which a plurality of resistors are connected; and
 a plurality of N-type metal oxide semiconductor (NMOS) transistors in which a plurality of gradation voltages formed by an upper limit voltage and a lower limit voltage being received through one end and the other end of the resistor string respectively are provided to drain electrodes, control signals are provided to gate electrodes, and the gradation voltages are output through source electrodes, wherein the plurality of NMOS transistors are arranged in a P well, and the P well and body electrodes of the plurality of NMOS transistors are electrically connected and receive a well bias voltage, and wherein the control signal is a signal that swings between any one of a maximum voltage of the gradation voltages and the upper limit voltage and any one of a minimum voltage of the gradation voltages and the lower limit voltage.

6. The digital-to-analog converter of claim 1, wherein the well bias voltage provided to the P well is any one of a minimum voltage of the plurality of gradation voltages and the lower limit voltage.

7. The digital-to-analog converter of claim 1, wherein the well bias voltage provided to the N well is any one of a maximum voltage of the plurality of gradation voltages and the upper limit voltage.

8. A digital-to-analog converter, comprising:
a resistor string in which a plurality of resistors are connected; and
a plurality of N-type metal oxide semiconductor (NMOS) transistors in which a plurality of gradation voltages formed by an upper limit voltage and a lower limit voltage being received through one end and the other end of the resistor string respectively are provided to drain electrodes, control signals are provided to gate electrodes, and the gradation voltages are output through source electrodes, wherein the plurality of NMOS transistors are arranged in a P well, and the P well and body electrodes of the plurality of NMOS transistors are electrically connected and receive a well bias voltage, wherein the digital-to-analog converter further comprises a plurality of P-type (PMOS) transistors in which the plurality of gradation voltages are respectively provided to source electrodes, the control signals are provided to control gate electrodes, and the gradation voltages are output through drain electrodes, wherein one or more PMOS transistors among the plurality of PMOS transistors are arranged in an N well, and the N well and body electrodes of the one or more PMOS transistors are electrically connected and receive a well bias voltage, and wherein the plurality of NMOS transistors arranged in the P well and the plurality of PMOS transistors arranged in the N well have an enduring voltage corresponding to a difference between a maximum voltage and a minimum voltage among the plurality of gradation voltages.

* * * * *